United States Patent
Himmelmann

(10) Patent No.: US 10,731,557 B1
(45) Date of Patent: Aug. 4, 2020

(54) CYCLONIC DIRT SEPARATOR FOR HIGH EFFICIENCY BRAYTON CYCLE BASED MICRO TURBO ALTERNATOR

(71) Applicant: HAMILTON SUNDSTRAND CORPORATION, Charlotte, NC (US)

(72) Inventor: Richard A. Himmelmann, Beloit, WI (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 16/389,249

(22) Filed: Apr. 19, 2019

(51) Int. Cl.
| | |
|---|---|
| *F02C 7/052* | (2006.01) |
| *B64D 33/00* | (2006.01) |
| *B64D 27/10* | (2006.01) |
| *B64D 27/02* | (2006.01) |
| *F02C 3/04* | (2006.01) |
| *H01L 35/30* | (2006.01) |
| *B01D 45/16* | (2006.01) |
| *F01D 15/10* | (2006.01) |
| *H02K 7/18* | (2006.01) |

(52) U.S. Cl.
CPC .............. *F02C 7/052* (2013.01); *B01D 45/16* (2013.01); *B64D 27/02* (2013.01); *B64D 27/10* (2013.01); *B64D 33/00* (2013.01); *F01D 15/10* (2013.01); *F02C 3/04* (2013.01); *H01L 35/30* (2013.01); *H02K 7/1823* (2013.01); *B64D 2027/026* (2013.01); *F05D 2220/32* (2013.01); *F05D 2220/768* (2013.01)

(58) Field of Classification Search
CPC ...................................................... F02C 7/052
USPC .................................. 290/52; 60/39.092, 650
See application file for complete search history.

(56) References Cited

U.S. PATENT DOCUMENTS

| | | | | |
|---|---|---|---|---|
| 4,669,395 A | * | 6/1987 | Brannstrom | F23J 15/027 110/216 |
| 4,756,257 A | * | 7/1988 | Vind | B01D 45/12 110/216 |
| 5,039,317 A | * | 8/1991 | Thompson | B01D 45/16 55/306 |

(Continued)

FOREIGN PATENT DOCUMENTS

| | | |
|---|---|---|
| CN | 201190153 Y | 2/2009 |
| CN | 102852567 A | 1/2013 |

(Continued)

*Primary Examiner* — Pedro J Cuevas
(74) *Attorney, Agent, or Firm* — Cantor Colburn LLP

(57) ABSTRACT

An electrical power generation system includes a micro turbo alternator having combustion chamber, a turbine driven by combustion gases from the combustion chamber and a compressor operably connected to the combustion chamber to provide a compressed airflow thereto. A permanent magnet generator is located along a shaft connecting the compressor and turbine such that electrical power is generated via rotation of the shaft, and a cyclonic dirt separator operably connected to a compressor inlet. The cyclonic dirt separator includes an air inlet, and an air exhaust disposed at opposing ends of a housing. The cyclonic dirt separator is configured to induce circumferential rotation into the airflow entering through the air inlet, and separate the airflow into a clean airflow and a relatively dirty airflow, such that the relatively dirty airflow flows through the air exhaust and the clean airflow is directed to the compressor inlet.

20 Claims, 7 Drawing Sheets

(56) References Cited

U.S. PATENT DOCUMENTS

| | | | |
|---|---|---|---|
| 5,095,707 A * | 3/1992 | Eck | B64G 1/421 |
| | | | 165/903 |
| 5,537,823 A * | 7/1996 | Vogel | F02C 1/007 |
| | | | 60/590 |
| 5,704,209 A * | 1/1998 | Bronicki | F01K 23/067 |
| | | | 60/650 |
| 6,056,237 A | 5/2000 | Woodland | |
| 6,392,313 B1 | 5/2002 | Epstein et al. | |
| 7,603,860 B2 * | 10/2009 | Thomas | F01D 15/00 |
| | | | 60/650 |
| 8,438,858 B1 | 5/2013 | Jones et al. | |
| 9,954,414 B2 * | 4/2018 | Cunningham | E21B 41/0007 |
| 9,982,599 B2 * | 5/2018 | Suciu | F02C 7/052 |
| 10,161,418 B2 * | 12/2018 | Cunningham | F04D 13/024 |
| 10,247,097 B2 * | 4/2019 | Suciu | F01D 25/12 |
| 10,309,310 B2 * | 6/2019 | Suciu | F02K 3/00 |
| 10,393,115 B2 * | 8/2019 | Cunningham | B01D 19/0042 |
| 10,443,139 B2 * | 10/2019 | Mills | H01L 31/0547 |
| 2003/0024233 A1 * | 2/2003 | Snyder | B01D 45/08 |
| | | | 60/39.092 |
| 2003/0177768 A1 | 9/2003 | Pellizzari | |
| 2004/0151598 A1 | 8/2004 | Young et al. | |
| 2005/0028793 A1 | 2/2005 | Pellizzari et al. | |
| 2005/0126624 A1 | 6/2005 | Pellizzari | |
| 2006/0065232 A1 | 3/2006 | Wurtz et al. | |
| 2008/0061559 A1 | 3/2008 | Hirshberg | |
| 2009/0180939 A1 | 7/2009 | Hagen et al. | |
| 2009/0214331 A1 | 8/2009 | Jewess et al. | |
| 2010/0031668 A1 * | 2/2010 | Kepplinger | F01K 23/067 |
| | | | 60/780 |
| 2011/0179763 A1 * | 7/2011 | Rajamani | B01D 45/14 |
| | | | 60/39.092 |
| 2012/0073261 A1 | 3/2012 | Palmer et al. | |
| 2014/0069354 A1 | 3/2014 | Pellizzari | |
| 2014/0183957 A1 | 7/2014 | Duchesneau | |
| 2015/0292408 A1 * | 10/2015 | Suciu | F02C 7/052 |
| | | | 415/121.2 |
| 2015/0292410 A1 * | 10/2015 | Suciu | F01D 25/12 |
| | | | 60/39.15 |
| 2015/0316072 A1 * | 11/2015 | Cunningham | F04D 13/024 |
| | | | 417/420 |
| 2015/0322756 A1 * | 11/2015 | Cunningham | F04D 25/026 |
| | | | 417/53 |
| 2015/0326094 A1 * | 11/2015 | Cunningham | E21B 41/0007 |
| | | | 310/87 |
| 2015/0337738 A1 * | 11/2015 | Suciu | F02K 3/00 |
| | | | 415/60 |
| 2015/0345265 A1 * | 12/2015 | Cunningham | F04D 13/083 |
| | | | 415/1 |
| 2016/0032904 A1 * | 2/2016 | Kaplan | G21C 1/00 |
| | | | 60/698 |
| 2016/0045841 A1 | 2/2016 | Kaplan et al. | |
| 2016/0208742 A1 | 7/2016 | Pande | |
| 2016/0290223 A1 | 10/2016 | Mills | |
| 2017/0104426 A1 | 4/2017 | Mills | |
| 2017/0122288 A1 * | 5/2017 | Gracia Bouthelier | F03D 3/0427 |
| 2018/0298816 A1 | 10/2018 | Conde | |
| 2019/0162118 A1 * | 5/2019 | Suciu | F01D 25/12 |
| 2020/0002828 A1 * | 1/2020 | Mills | H05H 1/24 |

FOREIGN PATENT DOCUMENTS

| | | |
|---|---|---|
| JP | 2012237276 A | 12/2012 |
| KR | 20160059516 A | 5/2016 |
| KR | 20170013357 A | 2/2017 |
| RU | 2354836 C1 | 5/2009 |
| RU | 2386828 C1 | 4/2010 |
| WO | 2004068593 A2 | 8/2004 |
| WO | 2005003547 A1 | 1/2005 |
| WO | 2005007506 A2 | 1/2005 |
| WO | 2010042218 A1 | 4/2010 |
| WO | 2013060693 A2 | 5/2013 |
| WO | 2015184252 A1 | 12/2015 |

* cited by examiner

CYCLONIC DIRT SEPARATOR FOR HIGH EFFICIENCY BRAYTON CYCLE BASED MICRO TURBO ALTERNATOR

BACKGROUND

Exemplary embodiments pertain to the art of electrical power generation and supply systems.

Some systems, such as unmanned aerial vehicles (UAV's) or the like often utilize electrical power for propulsion and operation of onboard systems. Some such systems, such as medium-sized UAV's that require power levels in the range of about 1 KW to 30 KW, have relatively short mission times because the energy density of batteries is far too low to effectively work in this power range, and conventional internal combustion engines and jet engines are very inefficient at these low power levels. One option that has been developed is a tethered UAV system in which the UAV is connected to a power source on the ground by a tether. Use of a tethered UAV allows for an increase in mission duration time, but reduces an operating height and distance in which the UAV may operate, due to the constraint of the tether.

Further, power generation and supply systems in, for example, UAV's or the like, must often operate in dusty environments, which may effect operability of the power generation and supply system.

BRIEF DESCRIPTION

In one embodiment, an electrical power generation system includes a micro turbo alternator having combustion chamber, a turbine driven by combustion gases from the combustion chamber and a compressor operably connected to the combustion chamber to provide a compressed airflow thereto. A shaft connects the turbine to the compressor such that rotation of the turbine drives rotation of the compressor. A permanent magnet generator is located along the shaft such that electrical power is generated via rotation of the shaft, and a cyclonic dirt separator operably connected to a compressor inlet. The cyclonic dirt separator includes an air inlet, and an air exhaust disposed at opposing ends of a housing. The cyclonic dirt separator is configured to induce circumferential rotation into the airflow entering through the air inlet, and separate the airflow into a clean airflow and a relatively dirty airflow, such that the relatively dirty airflow flows through the air exhaust and the clean airflow is directed to the compressor inlet.

Additionally or alternatively, in this or other embodiments a plurality of swirler vanes are located in the housing and are configured to induce the circumferential rotation to the airflow.

Additionally or alternatively, in this or other embodiments the plurality of swirler vanes extend from a hub radially outwardly to a housing wall of the housing.

Additionally or alternatively, in this or other embodiments a diffuser is located in the housing and spaced apart from a housing wall. The clean airflow flows through the diffuser, and the relatively dirty airflow flows between the diffuser and the housing wall.

Additionally or alternatively, in this or other embodiments the cyclonic dirt separator is connected to the compressor inlet via a clean airflow passage.

Additionally or alternatively, in this or other embodiments the clean airflow passage is connected to the diffuser downstream of a plurality of flow straightening vanes.

Additionally or alternatively, in this or other embodiments a thermoelectric energy recovery unit is operably connected to the micro turbo alternator, and the thermoelectric energy recovery unit discharges a discharge airflow into the dirt separator via an outlet air passage.

Additionally or alternatively, in this or other embodiments the outlet air passage is connected to the dirt separator upstream of a plurality of flow straightening vanes.

Additionally or alternatively, in this or other embodiments the combustion chamber utilizes JP-8 as fuel.

Additionally or alternatively, in this or other embodiments compressed air is used as a motive force to urge fuel to the combustion chamber.

In another embodiment, a vehicle includes a propulsion system, and an electrical power generation system operably connected to the propulsion system. The electrical power generation system includes a micro turbo alternator having a combustion chamber, a turbine driven by combustion gases from the combustion chamber and a compressor operably connected to the combustion chamber to provide a compressed airflow thereto. A shaft connects the turbine to the compressor such that rotation of the turbine drives rotation of the compressor, and a permanent magnet generator is located along the shaft such that electrical power is generated via rotation of the shaft. A cyclonic dirt separator is operably connected to a compressor inlet. The cyclonic dirt separator includes an air inlet and an air exhaust located at opposing ends of a housing. The cyclonic dirt separator is configured to induce circumferential rotation into the airflow entering through the air inlet, and separate the airflow into a clean airflow and a relatively dirty airflow, such that the relatively dirty airflow flows through the air exhaust and the clean airflow is directed to the compressor inlet.

Additionally or alternatively, in this or other embodiments a plurality of swirler vanes are located in the housing and are configured to induce the circumferential rotation to the airflow.

Additionally or alternatively, in this or other embodiments the plurality of swirler vanes extend from a hub radially outwardly to a housing wall of the housing.

Additionally or alternatively, in this or other embodiments a diffuser is located in the housing and spaced apart from a housing wall. The clean airflow flows through the diffuser, and the relatively dirty airflow flows between the diffuser and the housing wall.

Additionally or alternatively, in this or other embodiments the cyclonic dirt separator is connected to the compressor inlet via a clean airflow passage.

Additionally or alternatively, in this or other embodiments the clean airflow passage is connected to the diffuser downstream of a plurality of flow straightening vanes.

Additionally or alternatively, in this or other embodiments a thermoelectric energy recovery unit is operably connected to the micro turbo alternator. The thermoelectric energy recovery unit discharges a discharge airflow into the dirt separator via an outlet air passage.

Additionally or alternatively, in this or other embodiments the outlet air passage is connected to the dirt separator upstream of a plurality of flow straightening vanes.

Additionally or alternatively, in this or other embodiments the vehicle is an unmanned aerial vehicle.

Additionally or alternatively, in this or other embodiments compressed air is used as a motive force to urge fuel to the combustion chamber.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
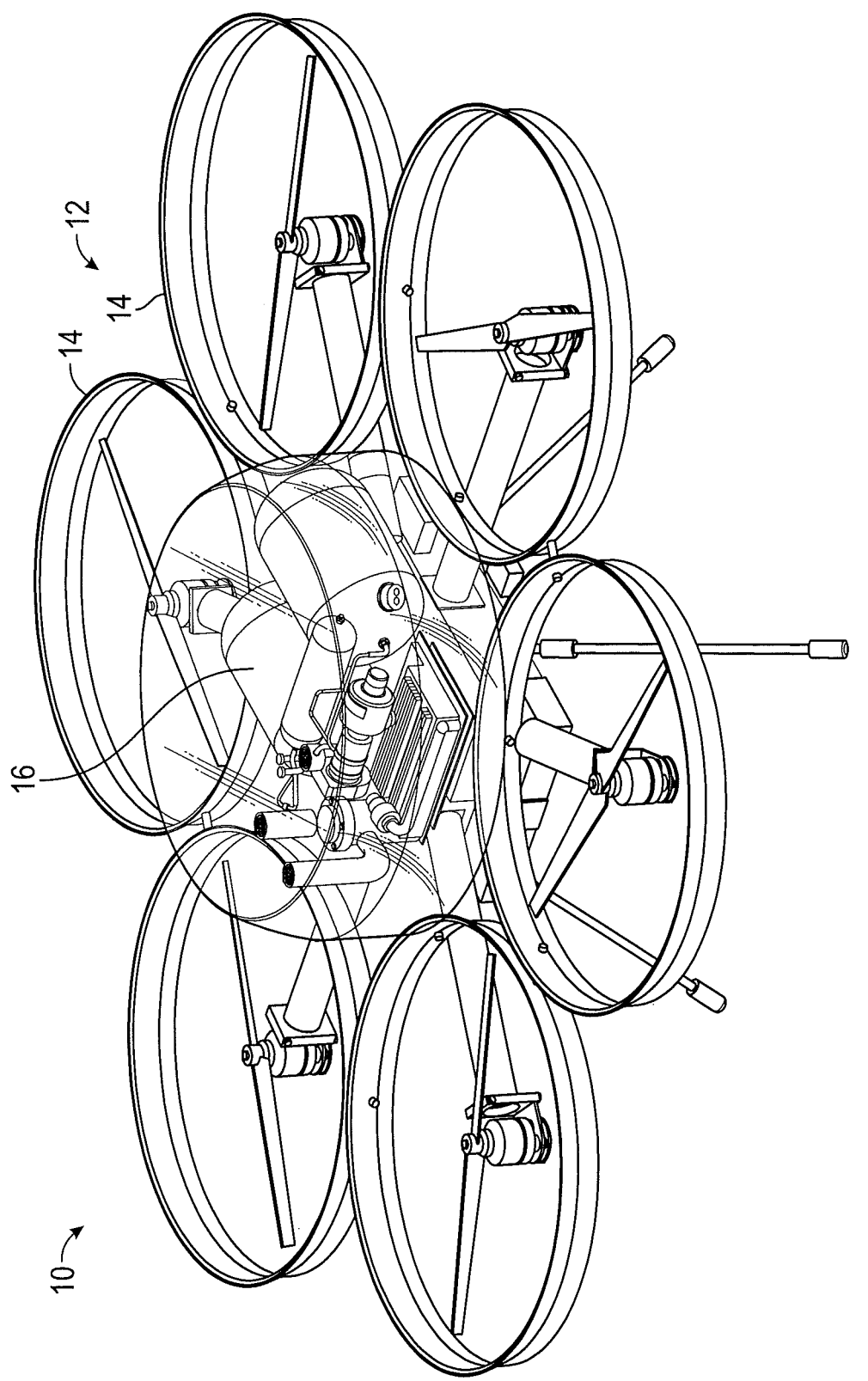
FIG. 1 is a schematic view of an embodiment of an unmanned aerial vehicle.
Figure 2:
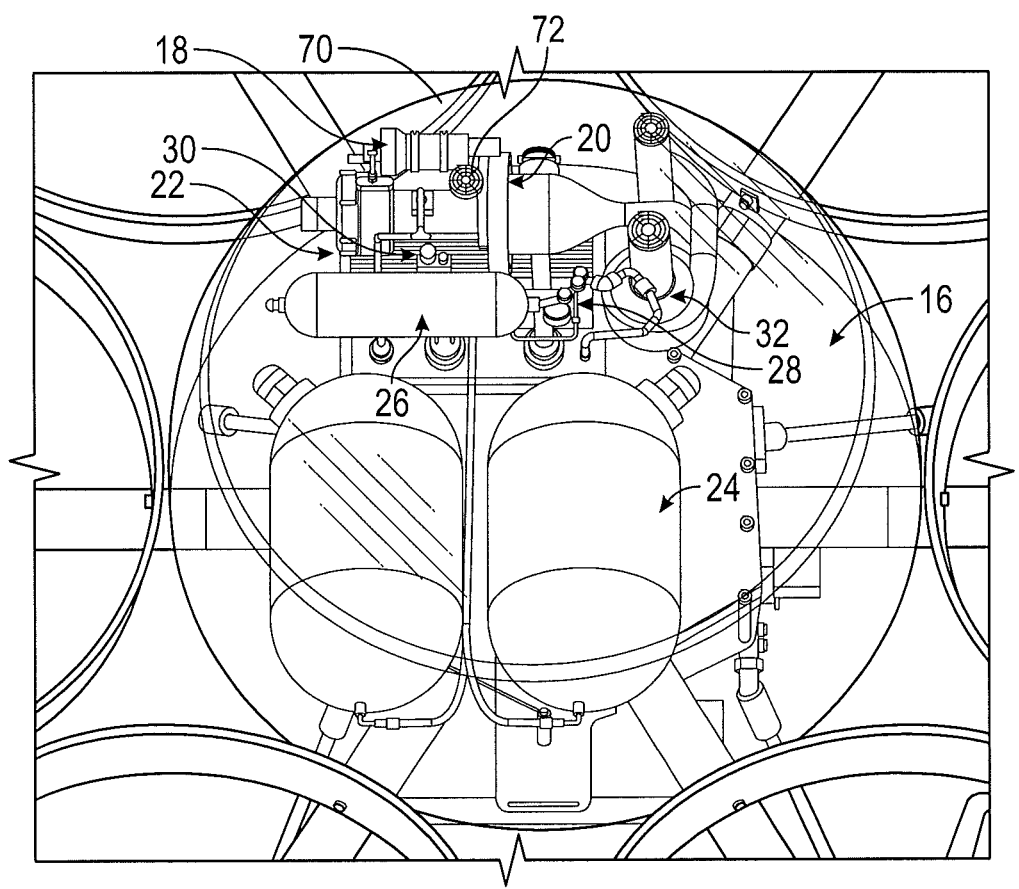
FIG. 2 is a schematic view of an embodiment of a power generation system.

Referring to FIG. 1, illustrated is an embodiment of an unmanned aerial vehicle (UAV) 10. The UAV 10 includes a propulsion/lift system 12, for example a plurality of lift rotors 14, operably connected to a power conversion system 16, which is, for example, a high efficiency Brayton cycle micro turbine alternator system. Referring to FIG. 2, the power conversion system 16 includes a combustion chamber 18, in which a fuel-air mixture is combusted, with the combustion products utilized to drive a turbo-alternator 20. The turbo-alternator 20 converts the energy of the combustion products into electrical power by urging the combustion products through a turbine (not shown) of the turbo-alternator 20. The electrical energy is rectified via a generator rectifier 22 and utilized by the propulsion/lift system 12. The fuel is provided from one or more fuel storage tanks 24 operably connected to the combustion chamber 18. In some embodiments, the fuel utilized is JP-8. The power conversion system 16 may utilize compressed air provided from a compressed air tank 26 at 4500 psig and regulated to about 750 psig at a pressure regulator 28. The regulated compressed air is utilized to provide the motive pressure required to drive the liquid fuel through a turbine speed control valve 30 and into the combustion chamber 18. Some embodiments further include a thermal electric energy recovery system 32, configured to recover additional energy from exhaust gases of the power conversion system 16. In some embodiments, the power conversion system 16 is enclosed in a system enclosure 70, and may include one or more enclosure vents 72 in a wall of the system enclosure 70 to vent fumes or the like from the system enclosure 70.

Figure 3:
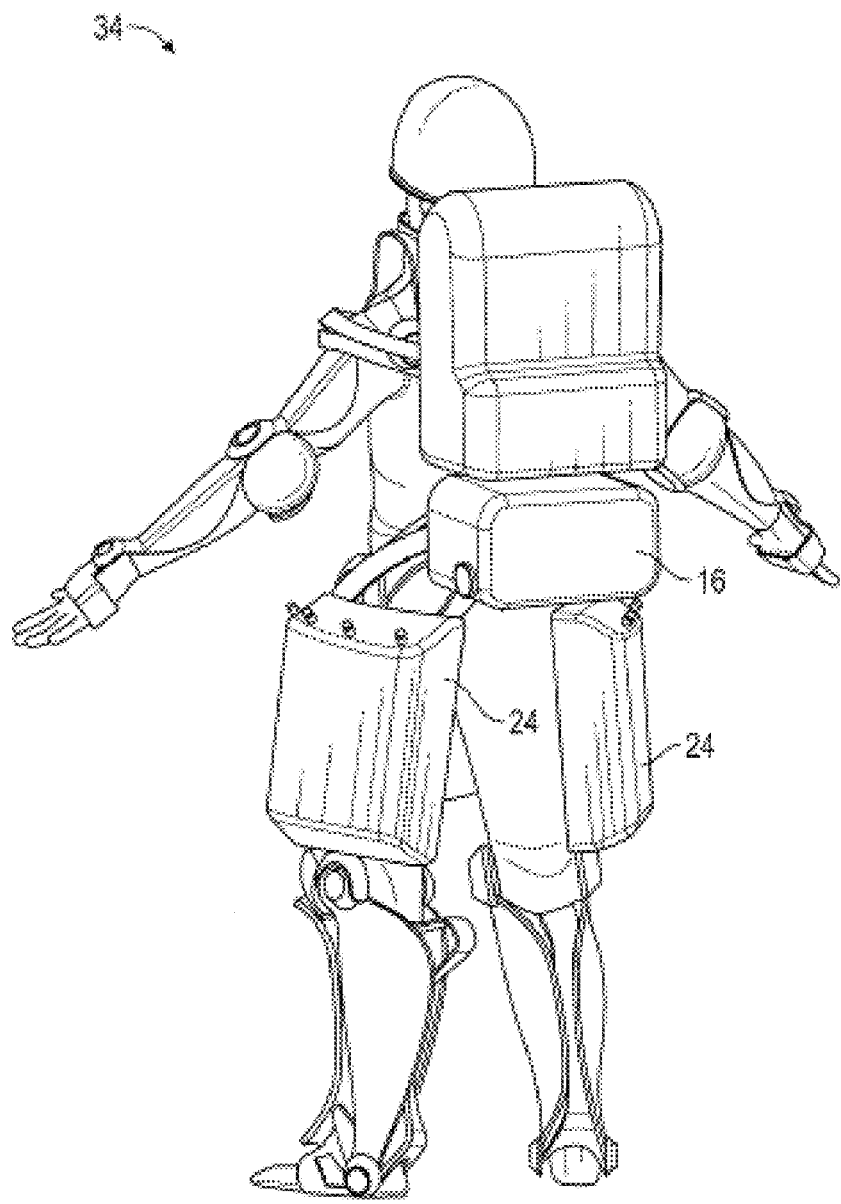
FIG. 3 illustrates an embodiment of a powered suit including a power generation system.

While in FIG. 1, the power conversion system 16 is described as utilized in a UAV 10, the power conversion system 16 disclosed herein may be readily applied to other systems, and may be utilized in, for example, an electrically-powered suit 34, as shown in FIG. 3.

Figure 4:
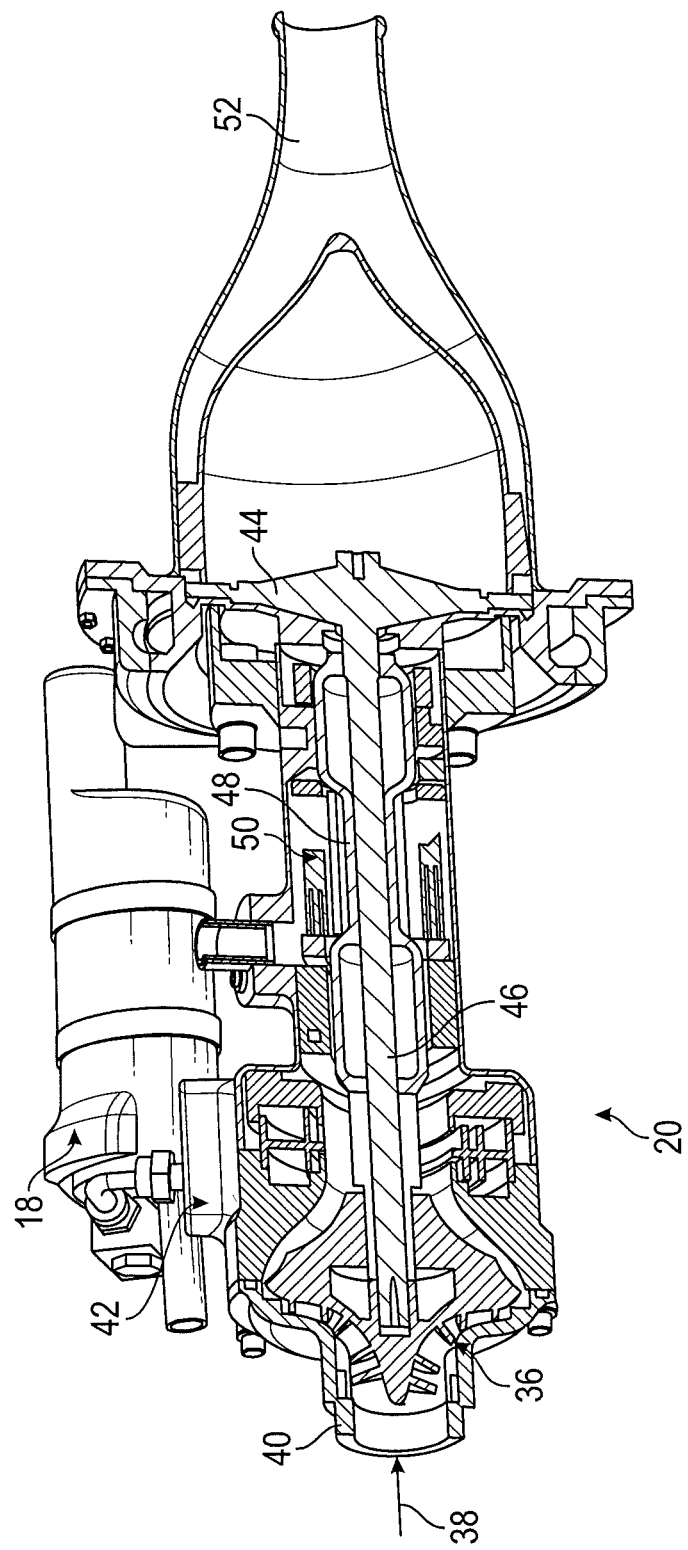
FIG. 4 is a cross-sectional view of an embodiment of a micro turbo alternator.

Referring now to FIG. 4, the turbo-alternator 20 includes a radial compressor 36, which compresses an airflow 38 input into the radial compressor 36 at a compressor inlet 40. Once compressed, the airflow 38 exits the compressor 36, at a compressor outlet 42, the airflow 38 is introduced to the combustion chamber 18 for combustion with the fuel. The combustion products are used to drive rotation of the turbine 44, which is connected to the compressor 36 via a shaft 46 and drives rotation of the compressor 36 via the shaft 46. The shaft 46 further drives a rotor 48 of a permanent magnet generator 50 to generate electrical power from the rotational energy of the shaft 46. The combustion products are exhausted from the turbine 44 through a turbine exit 52.

Figure 5:
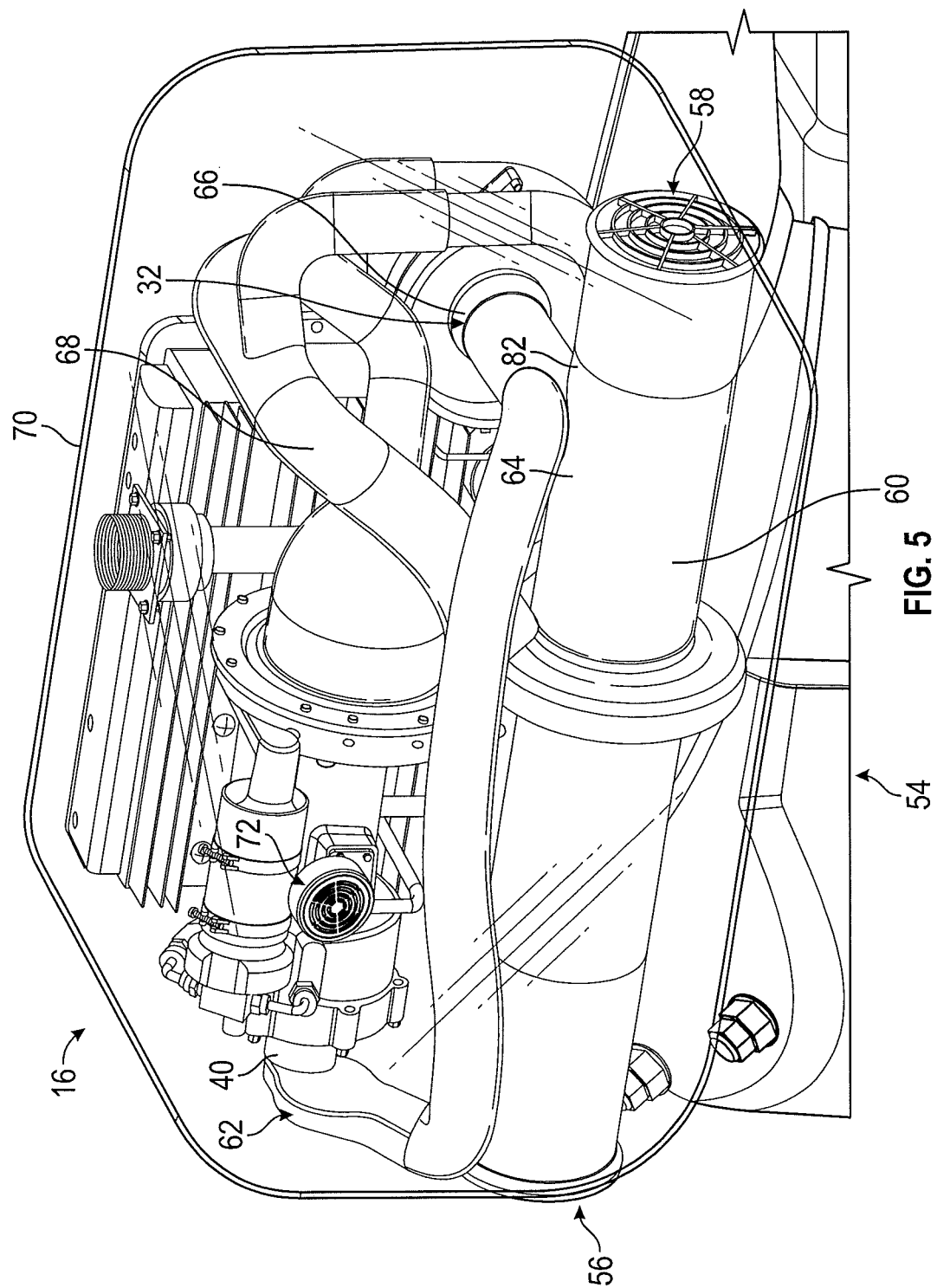
FIG. 5 is a cross-sectional view of an embodiment of a cyclonic dirt separator for a micro turbo alternator.

Referring now to FIG. 5, a cyclonic dirt separator 54 is provided to provide clean airflow 38 to the compressor inlet 40, and in some embodiments to an inlet of the thermal electric energy recovery system 32. The dirt separator 54 includes an air inlet 56 and an air exhaust 58 at opposing ends of a cylindrical housing 60 of the dirt separator 54. Further, a clean airflow passage 62 extends from a sidewall 64 of the housing 60 to the compressor inlet 40, and to the recovery inlet 66 of the thermal electric energy recovery system 32. An outlet air passage 68 extends from the turbine exit 52 to the sidewall 64 of the housing 60 to direct turbine exhaust gases from the turbine exit 52 to the dirt separator 54.

Figure 6:
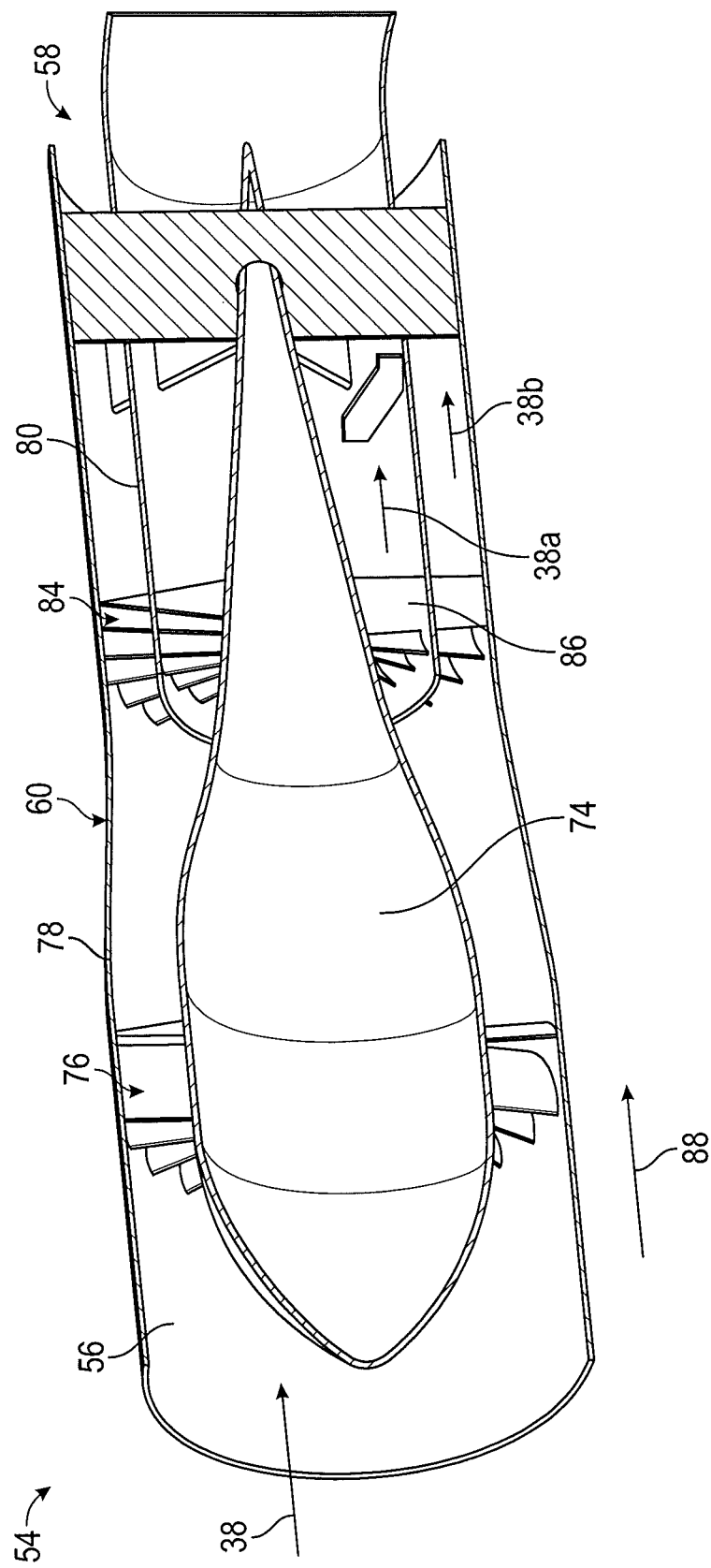
FIG. 6 is a cross-sectional view of an embodiment of a dirt separator.

Referring now to FIG. 6, a cross-sectional view of the dirt separator 54 is shown. The dirt separator 54 includes a hub 74 located in the housing 60 between the air inlet 56 and the air exhaust 58. A plurality of swirler vanes 76 extend from the hub 74 to a housing wall 78. The swirler vanes 76 are configured to impart circumferential swirl in the airflow 38 flowing through the dirt separator 54 from the air inlet 56. The circumferential swirl of the airflow 38 has a centrifuge effect, urging particles such as dirt in the airflow 38 toward the housing wall 78, while leaving relatively clean airflow 38 nearer to the hub 74. A diffuser 80 is located downstream of the swirler vanes 76. The clean airflow 38a is flowed through the diffuser 80 to an air outlet port 82 (best shown in FIG. 7), while the relatively dirty airflow 38b flows between the diffuser 80 and the housing wall 78 and passes through the air exhaust 58. In some embodiments, a plurality of dirty air flow straightening vanes 84 extend between the diffuser 80 and the housing wall 78 and/or a plurality of clean air flow straightening vanes 86 extend between the hub 74 and the diffuser 80 wall. The flow straightening vanes 84, 86 are configured to remove the circumferential swirl from the airflow 38a, 38b, and direct the airflow 38a, 38b along an axial direction 88 of the dirt separator 54. The clean airflow 38a passes through the clean airflow straightening vanes 86, converting the dynamic pressure associated with the high velocity of the clean airflow 38a. The clean airflow 38a then passes through the diffuser 80, converting the remaining dynamic energy into static pressure before entering the clean airflow passage 62 (shown in FIG. 7).

Figure 7:
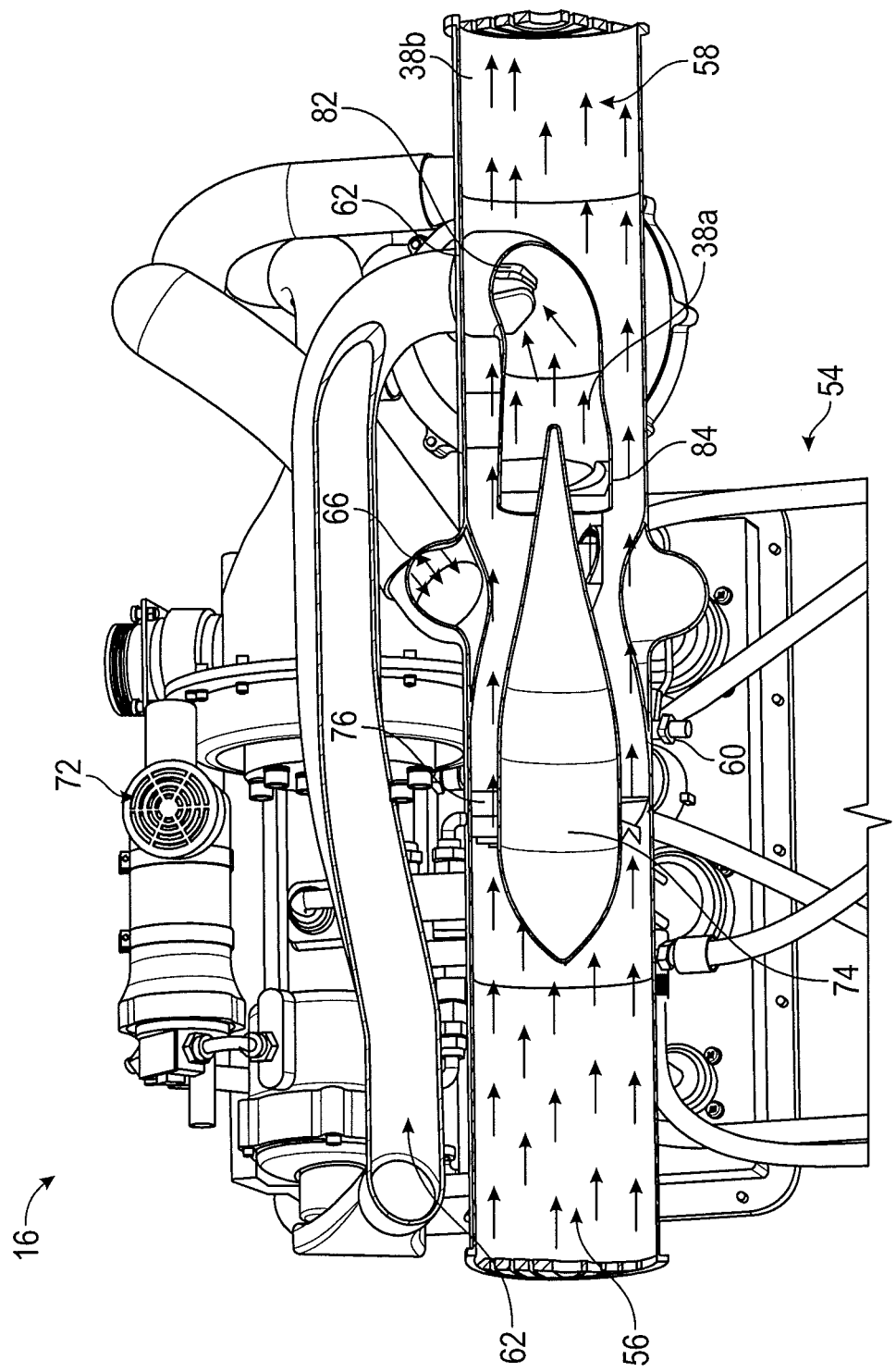
FIG. 7 is another cross-sectional view of an embodiment of a cyclonic dirt separator for a micro turbo alternator.

Referring now to FIG. 7, the clean airflow 38a exits the diffuser 80 through the clean airflow passage 62, which extends from the housing 60 downstream of the flow straightening vanes 84. The outlet air passage 66 connects to the dirt separator 54 axially between the swirler vanes 76 and the flow straightening vanes 84. This relatively high temperature turbine exhaust air provides additional motive flow to the dirt separator which helps to draw air into inlet 56 (acting like an ejector pump). The relatively high temperature turbine exhaust air is mixed with the dirty air 38b to reduce the thermal signature of the turbine exhaust flow.

The dirt separator 54 disclosed herein efficiently provides clean airflow 38a for use by the turbo alternator 20, while separating foreign objects such as dirt and sand into the relatively dirty airflow 38b, which is exhausted from the dirt separator 54 without being introduced to the turbo alternator 20, thus extending its service life and improving its performance.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An electrical power generation system, comprising:
   a micro turbo alternator, including:
      a combustion chamber;
      a turbine driven by combustion gases from the combustion chamber;
      a compressor operably connected to the combustion chamber to provide a compressed airflow thereto;
      a shaft connecting the turbine to the compressor such that rotation of the turbine drives rotation of the compressor; and
      a permanent magnet generator disposed along the shaft such that electrical power is generated via rotation of the shaft; and
   a cyclonic dirt separator operably connected to a compressor inlet, the cyclonic dirt separator including:
      an air inlet; and
      an air exhaust disposed at opposing ends of a housing;
      wherein the cyclonic dirt separator is configured to induce circumferential rotation into the airflow entering through the air inlet, and separate the airflow into a clean airflow and a relatively dirty airflow, such that the relatively dirty airflow flows through the air exhaust and the clean airflow is directed to the compressor inlet.

2. The electrical power generation system of claim 1, further comprising a plurality of swirler vanes disposed in the housing configured to induce the circumferential rotation to the airflow.

3. The electrical power generation system of claim 2, wherein the plurality of swirler vanes extend from a hub radially outwardly to a housing wall of the housing.

4. The electrical power generation system of claim 1, further comprising a diffuser disposed in the housing and spaced apart from a housing wall;
   wherein the clean airflow flows through the diffuser, and the relatively dirty airflow flows between the diffuser and the housing wall.

5. The electrical power generation system of claim 1, wherein the cyclonic dirt separator is connected to the compressor inlet via a clean airflow passage.

6. The electrical power generation system of claim 5, wherein the clean airflow passage is connected to the diffuser downstream of a plurality of flow straightening vanes.

7. The electrical power generation system of claim 1, further comprising a thermoelectric energy recovery unit operably connected to the micro turbo alternator, wherein the thermoelectric energy recovery unit discharges a discharge airflow into the dirt separator via an outlet air passage.

8. The electrical power generating system of claim 6, wherein the outlet air passage is connected to the dirt separator upstream of a plurality of flow straightening vanes.

9. The electrical power generating system of claim 1, wherein the combustion chamber utilizes JP-8 as fuel.

10. The electrical power generating system of claim 1, wherein compressed air is used as a motive force to urge fuel to the combustion chamber.

11. A vehicle, comprising:
    a propulsion system; and
    an electrical power generation system operably connected to the propulsion system, including:
       a micro turbo alternator, including:
          a combustion chamber;
          a turbine driven by combustion gases from the combustion chamber;
          a compressor operably connected to the combustion chamber to provide a compressed airflow thereto;
          a shaft connecting the turbine to the compressor such that rotation of the turbine drives rotation of the compressor; and
          a permanent magnet generator disposed along the shaft such that electrical power is generated via rotation of the shaft; and
       a cyclonic dirt separator operably connected to a compressor inlet, the cyclonic dirt separator including:
          an air inlet; and
          an air exhaust disposed at opposing ends of a housing;
          wherein the cyclonic dirt separator is configured to induce circumferential rotation into the airflow entering through the air inlet, and separate the airflow into a clean airflow and a relatively dirty airflow, such that the relatively dirty airflow flows through the air exhaust and the clean airflow is directed to the compressor inlet.

12. The electrical power generation system of claim 11, further comprising a plurality of swirler vanes disposed in the housing configured to induce the circumferential rotation to the airflow.

13. The electrical power generation system of claim 12, wherein the plurality of swirler vanes extend from a hub radially outwardly to a housing wall of the housing.

14. The electrical power generation system of claim 11, further comprising a diffuser disposed in the housing and spaced apart from a housing wall;
    wherein the clean airflow flows through the diffuser, and the relatively dirty airflow flows between the diffuser and the housing wall.

15. The electrical power generation system of claim 11, wherein the cyclonic dirt separator is connected to the compressor inlet via a clean airflow passage.

16. The electrical power generation system of claim 15, wherein the clean airflow passage is connected to the diffuser downstream of a plurality of flow straightening vanes.

17. The electrical power generation system of claim 11, further comprising a thermoelectric energy recovery unit operably connected to the micro turbo alternator, wherein the thermoelectric energy recovery unit discharges a discharge airflow into the dirt separator via an outlet air passage.

18. The electrical power generating system of claim 17, wherein the outlet air passage is connected to the dirt separator upstream of a plurality of flow straightening vanes.

19. The electrical power generating system of claim 11, wherein the vehicle is an unmanned aerial vehicle.

20. The electrical power generating system of claim 11, wherein compressed air is used as a motive force to urge fuel to the combustion chamber.

\* \* \* \* \*